United States Patent [19]
Ahn et al.

[11] Patent Number: 5,943,289
[45] Date of Patent: Aug. 24, 1999

[54] HIERARCHICAL WORD LINE STRUCTURE

[75] Inventors: Jin-Hong Ahn, Kyungki-Do; Jeong-Su Jeong, Seoul, both of Rep. of Korea

[73] Assignee: LG Semicon Co., Ltd., Cheongju, Rep. of Korea

[21] Appl. No.: 09/025,111

[22] Filed: Feb. 17, 1998

[30] Foreign Application Priority Data

Feb. 19, 1997 [KR] Rep. of Korea ............... 97-4994

[51] Int. Cl.$^6$ .................................................. G11C 8/00
[52] U.S. Cl. .............................. 365/230.06; 365/185.23
[58] Field of Search ................... 365/185.11, 185.23, 365/230.06, 230.03

[56] References Cited

U.S. PATENT DOCUMENTS

| | | | |
|---|---|---|---|
| 5,406,526 | 4/1995 | Sugibayashi et al. | 365/230.03 |
| 5,640,359 | 6/1997 | Suzuki et al. | 365/230.06 |
| 5,706,245 | 1/1998 | Kim | 365/230.06 |
| 5,708,620 | 1/1998 | Jeong | 365/230.06 |
| 5,781,498 | 7/1998 | Suh | 365/230.06 |
| 5,835,439 | 11/1998 | Suh | 365/185.11 |
| 5,854,770 | 12/1998 | Pascucci | 365/230.03 |
| 5,862,098 | 1/1999 | Jeong | 365/230.06 |
| 5,875,149 | 2/1999 | Oh et al. | 365/230.06 |

OTHER PUBLICATIONS

K. Noda, et al., "A Boosted Dual Word-line Decoding Scheme for 56Mb DRAMs", VLSI Development Division, NEC Corporation, Symposium on VLSI Circuits Digest of Technical Papers, pp. 112–113, 1992.

T. Sugibaysahi, et al., "A 30ns 256Mb DRAM with Multi-Divided Array Structure", IEEE International Solid-State Circuits Conference, Non-Volatile, Dynamic, an Experimental Memories/Papers, pp. 50–51 and 262, 1993.

Primary Examiner—David Nelms
Assistant Examiner—VanThu Nguyen
Attorney, Agent, or Firm—Fleshner & Kim

[57] ABSTRACT

A hierarchical word line structure for a semiconductor memory is provided that substantially eliminates coupling noise between neighboring wiring lines by driving neighboring sub-word lines by different main word lines. The hierarchical word line structure further reduces a layout size. The hierarchical word line structure uses one less transistor than a related art sub-word line driver. The word line includes a plurality of word line rows that each include a plurality of sub-word line drivers. The sub-word line drivers receive sub-word line driver enable signals among which only one signal becomes high level at a time. Each of the word line rows correspond to a main word line and a subset of the plurality of sub-word line drivers that drive neighboring sub-word lines are coupled to different respective main word lines.

17 Claims, 6 Drawing Sheets

HIERARCHICAL WORD LINE STRUCTURE

BACKGROUND OF THE INVENTION

1. Field of the Invention

The present invention relates to a semiconductor device, and in particular, to a hierarchical word line structure of a semiconductor memory device.

2. Background of the Related Art

FIG. 1 illustrates a related art hierarchical word line structure. As shown in FIG. 1, the related art hierarchical word line structure includes a plurality of word line rows R1, R2, and R3 each including sub-word line drivers SWD0 through SWD3.

For example, the first word line row R1 includes a sub-word line driver SWD0 connected with a pair of main word lines MWL0 and MWL0b. The sub-word line driver SWD0 receives a sub-word line driver enable signal SWDEN0 and drivers a sub-word line SWL0. A sub-word line driver SWD1 is connected with the main word lines MWL0 and MWL0b. The sub-word line driver SWD1 receives a sub-word line driver enable signal SWDEN1 and drives a sub-word line SWL1. A sub-word line driver SWD2 is connected with the main word lines MWL0 and MWL0b. The sub-word line driver SWD2 receives a sub-word line driver enable signal SWDEN2 and drives a sub-word line SWL2. A sub-word line driver SWD3 is connected with the main word lines MWL0 and MWL0b. The sub-word line driver SWD3 receives a sub-word line driver enable signal SWDEN3 and drives a sub-word line SWL3.

The main word lines MWL0 and MWL0b are complementary to each other. The sub-word line driver enable signals SWDEN0, SWDEN1, SWDEN2, and SWDEN3 are one bit signals of a row address. Among the above-described signals, only one signal becomes high level at a time.

The second word line row R2 includes sub-word line drivers SWD0 through SWD3 connected with a pair of main word lines MWL1 and MWL1b. In the second word line row R2, the sub-word line drivers SWD0 through SWD3 receive sub-word line driver enable signals SWDEN0 through SWDEN3 and drive sub-word lines SWL4 through SWL7. In addition, the third word line row R3 includes sub-word line drivers SWD0 through SWD3 connected with a pair of main word lines MWL2 and MWL2b for receiving sub-word line driver enable signals SWDEN0 through SWDEN3.

As shown in FIG. 2, the sub-word line driver SWD0 includes a PMOS transistor MP1 whose gate is connected with the main word line MWL0b. The source of the PMOS transistor MP1 receives the sub-word line driver enable signal SWDEN0, and the drain is connected with the sub-word line SWL0. An NMOS transistor MN1 has its gate connected with the main word line MWL0b. The drain of the NMOS transistor MN1 is connected with the sub-word line SWL0, and the source is connected to ground. An NMOS transistor MN2 has its gate connected with the main word line MWL0. The drain of the NMOS transistor MN2 receives the sub-word line driver enable signal SWDEN0, and the source is connected with the sub-word line SWL0. The sub-word line drivers SWD1 through SWD3 have the same construction as the sub-word line driver SWD0.

The operation of the related art hierarchical word line structure will now be described. When a high level signal is inputted to the main word line MWL0, the first word line row R1 is selected, and the NMOS transistor MN2 of the sub-word line driver SWD0 is turned on. The main word line MWL0 is an upper word line. Sequentially, a low level signal is applied to the main word line MWL0b, and the PMOS transistor MP1 is turned on and the NMOS transistor MN1 is turned off. When a high level sub-word line driver enable signal SWDEN0 is applied to the sub-word line driver SWD0, a high level signal is outputted to the sub-word line SWL0 to drive an actual word line.

However, an important factor when driving the word line is a coupling noise. The sub-word line that receives much coupling noise during the driving of the sub-word line SWL0 is sub-word line SWL2. Namely, as shown in FIG. 3, when the sub-word line SWL0 is driven by the sub-word line driver SWD0, a coupling noise can be applied to the sub-word line SWL2. The sub-word line SWL2 is driven by the sub-word line driver SWD2. At this time, the PMOS transistor MP1' and the NMOS transistor MN2' of the sub-word line driver SWD2 are turned on, while the NMOS transistor MN1' is turned off. In addition, a low level sub-word line driver enable signal SWDEN2 is applied to the source of the PMOS transistor MP1' and the drain of the NMOS transistor MN2', respectively.

However, the related art hierarchical word line structure has various disadvantages because a pair of main word lines MWL0 and MWL0b and sub-word line driver enable signals SWDEN0, SWDEN1 or SWDEN2, SWDEN3 are used. A coupling noise can appear between adjacent sub-word line drivers. Further, an additional sub-word line driver is needed relative to a word line shunt method. In addition, the layout size is disadvantageously increased.

SUMMARY OF THE INVENTION

An object of the present invention to provide a hierarchical word line structure that substantially overcomes at least the aforementioned problems encountered in the related art.

Another object of the present invention to provide a hierarchical word line structure that eliminates a coupling noise by driving neighboring sub-word lines using different main word lines.

Yet another object of the present invention is to provide a hierarchical word line structure having fewer transistors to decrease a layout size.

To achieve at least the above objects in whole or in parts, there is provided a word line circuit according to the present invention that includes a plurality of word line rows, each word line row including a pair of sub-word line drivers which receive sub-word line driver enable signals. Among the pair of sub-word line drivers, only one signal becomes high level at a time. Further, the word line rows correspond to each main word line, and pairs of sub-word line drivers for driving neighboring sub-word lines among the sub-word lines are coupled with another main word line.

To achieve the above objects in whole or in parts, there is provided a hierarchical word line circuit for a semiconductor memory device according to the present invention that includes a plurality of word lines; and a plurality of word line rows, each word line row including a plurality of sub-word line driving units for receiving at least one sub-word line driver enable signals, wherein each of the word line rows correspond to one of the plurality of word lines, and wherein each of the plurality of the sub-word line driving units are coupled with different word lines of the plurality of word lines.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
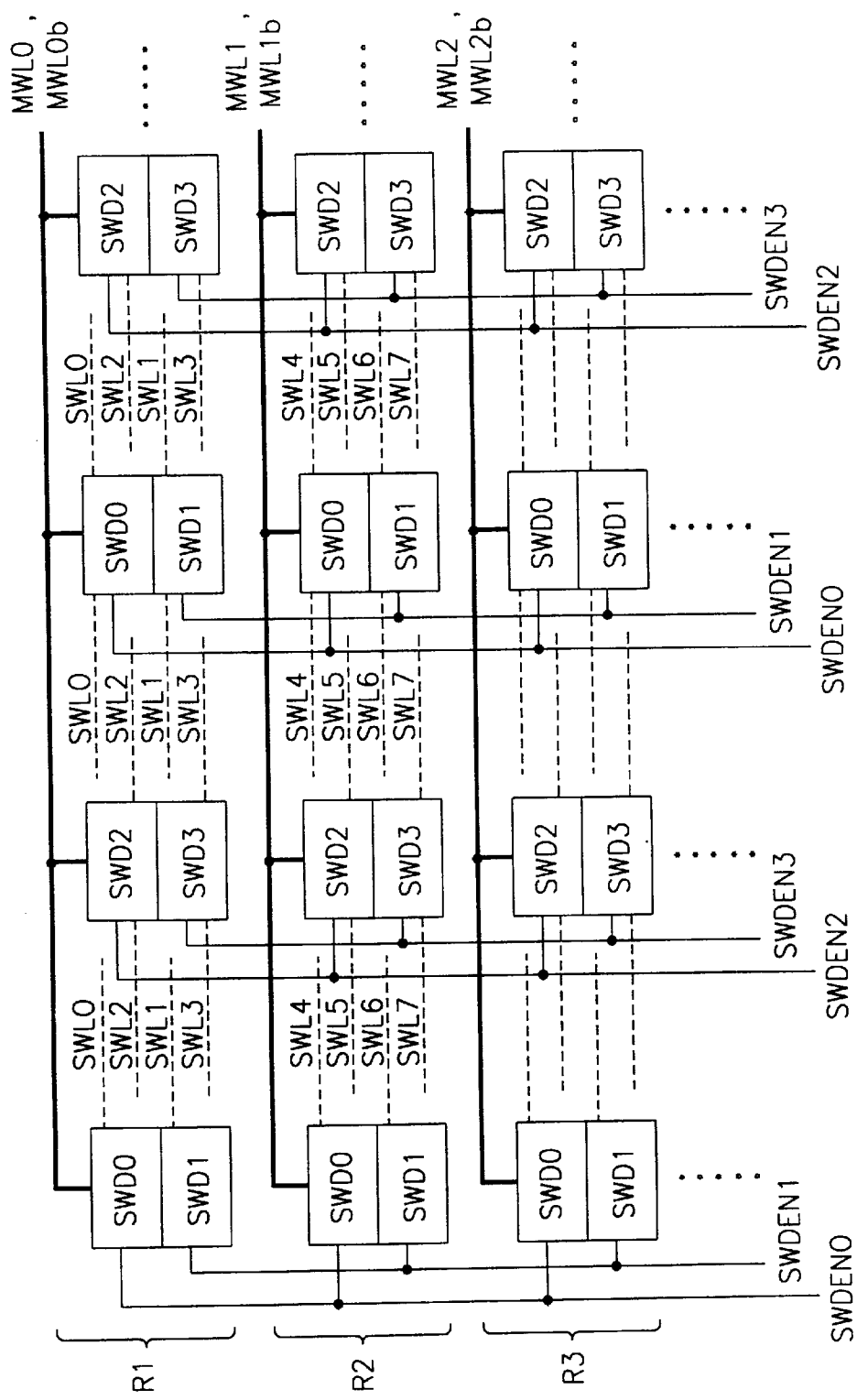
FIG. 1 is a diagram illustrating a related art hierarchical word line structure.
Figure 2:
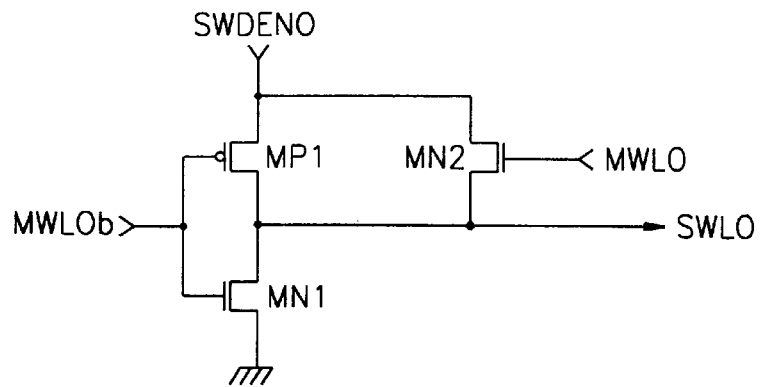
FIG. 2 is a circuit diagram illustrating a sub-word line driver in the circuit of FIG. 1.
Figure 3:
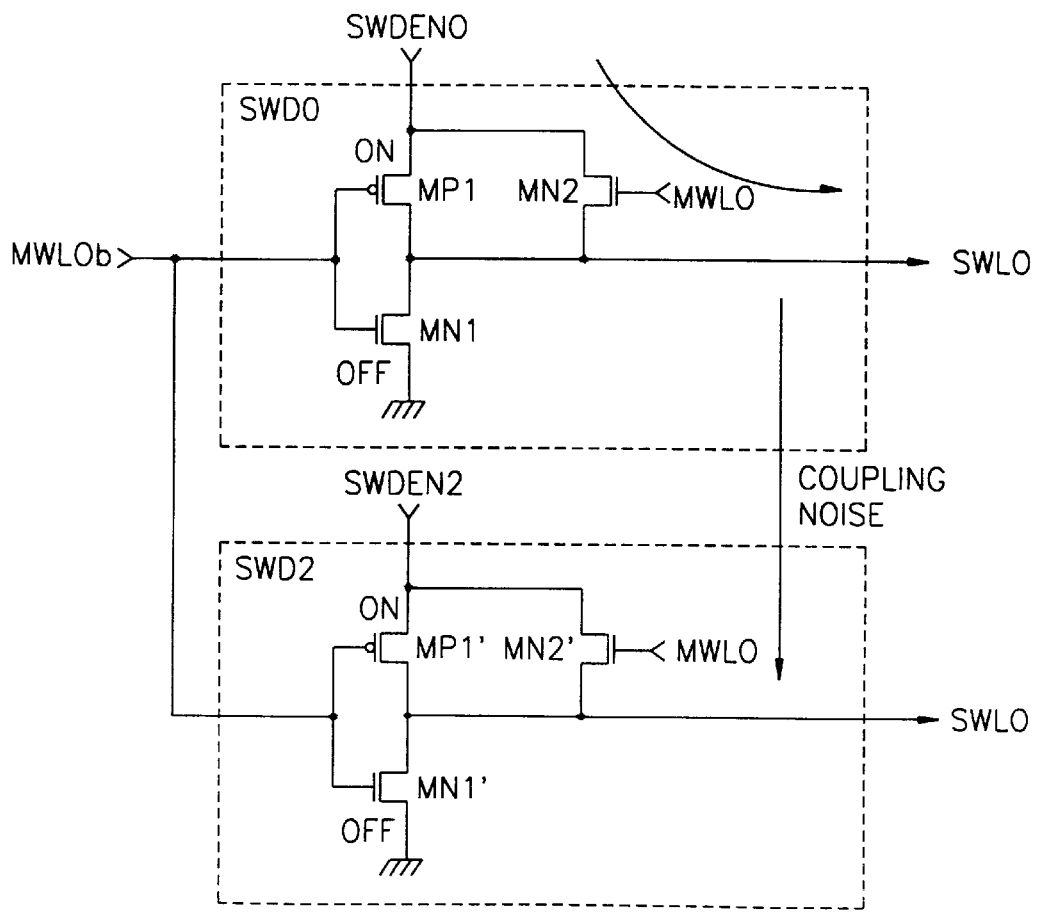
FIG. 3 is a circuit diagram illustrating a coupling noise of a sub-word line driver in the circuit of FIG. 1.
Figure 4:
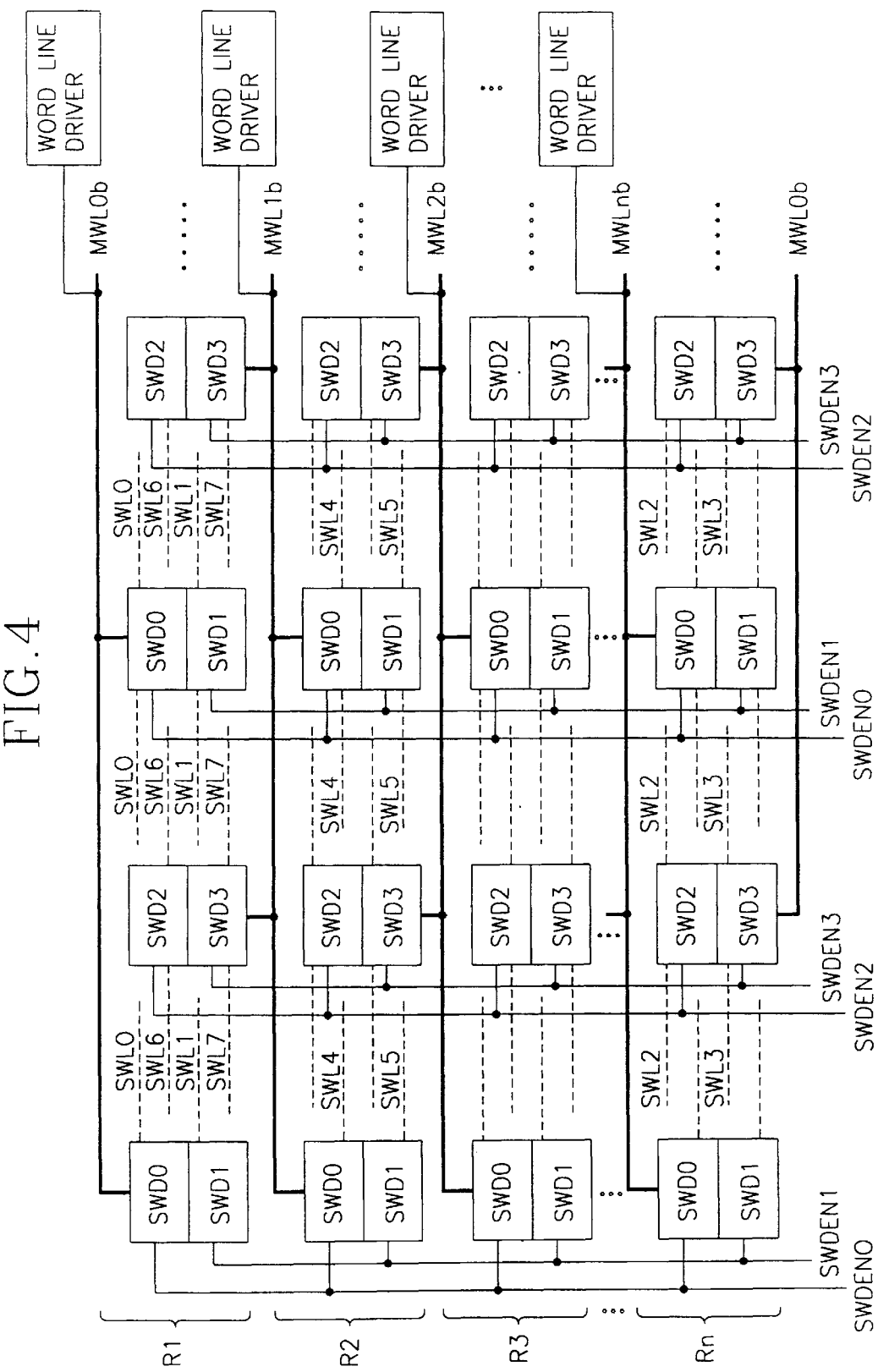
FIG. 4 is a diagram illustrating a hierarchical word line structure according to a preferred embodiment of the present invention.

FIG. 4 illustrates a hierarchical word line structure according to a first preferred embodiment of the present invention. As shown in FIG. 4, the first preferred embodiment of hierarchical word line structure includes a plurality of word line rows R1 through Rn that correspond with a plurality of main word lines MWL0b through MWLnb. Each of the word line rows R1 through Rn includes a pair of sub-word line drivers SWD0 and SWD1, a pair of sub-word line drivers SWD2 and SWD3 or the like. The sub-word line drivers SWD0 and SWD1 receive a pair of complementary sub-word line driver enable signals SWDEN0 and SWDEN1. The sub-word line drivers SWD2 and SWD3 receive a pair of complementary sub-word line driver enable signals SWDEN2 and SWDEN3.

The first main word line MWL0b among the main word lines MWL0b through MWLnb is coupled to only a pair of sub-word line drivers SWD0 and SWD1 that are (2n+1)th drivers included in the first word line row R1. The remaining main word lines MWL1b, MWL2b, . . . , MWLnb are coupled to the pair of the (2n+1)th sub-word line drivers SWD0 and SWD1 of a corresponding word line row and the pair of the (2n)th sub-word line drivers SWD2 and SWD3 of the previous word line row, respectively. In addition, the pair of the (2n)th sub-word line drivers SWD2 and SWD3 included in the last word line row Rn are coupled to the first main word line MWL0b.

The sub-word line drivers SWD0 and SWD1 included in the first word line row R1 are coupled with the sub-word lines SWL0 and SWL1, and the sub-word line drivers SWD2 and SWD3 are coupled with the sub-word lines SWL6 and SWL7. The sub-word line drivers SWD0 and SWD1 included in the second word line row R2 are coupled with the sub-word lines SWL4 and SWL5. The sub-word line drivers SWD2 and SWD3 included in the last word line row Rn are coupled with the sub-word lines SWL2 and SWL3.

Figure 5:
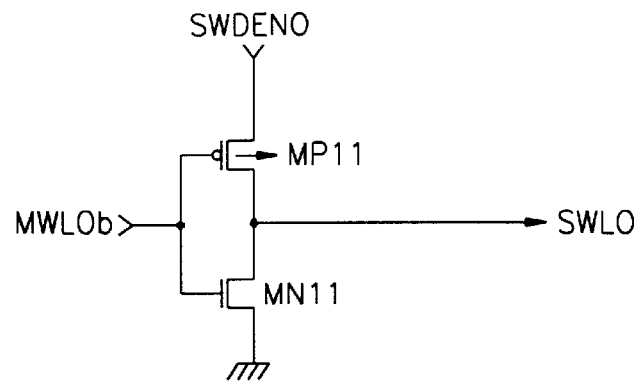
FIG. 5 is a circuit diagram illustrating a sub-word line driver in the circuit of FIG. 4.

As shown in FIG. 5, the sub-word line driver SWD0 includes a PMOS transistor MP11 has the gate coupled with the main word line MWL0b. The source of the PMOS transistor MP11 receives a sub-word line driver enable signal SWDEN0, and the drain is coupled with the sub-word line SWL0. An NMOS transistor MN11 has the gate coupled with the main word line MWL0b. The drain of the NMOS transistor MN11 is coupled with the sub-word line SWL0, and the source is coupled with a ground.

Operations of the first preferred embodiment of the hierarchical word line structure according to the present invention will now be described. The main word lines MWL0b through MWLnb are driven by a low level signal, and the sub-word line driver enable signals SWDEN0, SWDEN1, SWDEN2, and SWDEN3 are inputted into the sub-word line drivers SWD0 through SWD3 of each of the word line rows R1 through Rn, similar to the related art. When a low level signal is applied to the main word line MWL0b, the first word line row R1 is selected. At this time, the PMOS transistor MP11 is turned on, and the NMOS transistor MN11 is turned off. Additionally, when a high level sub-word line driver enable signal SWDEN0 is applied to the sub-word line driver SWD0, a high level signal is outputted to the sub-word line SWL0 to drive an actual word line.

Figure 6:
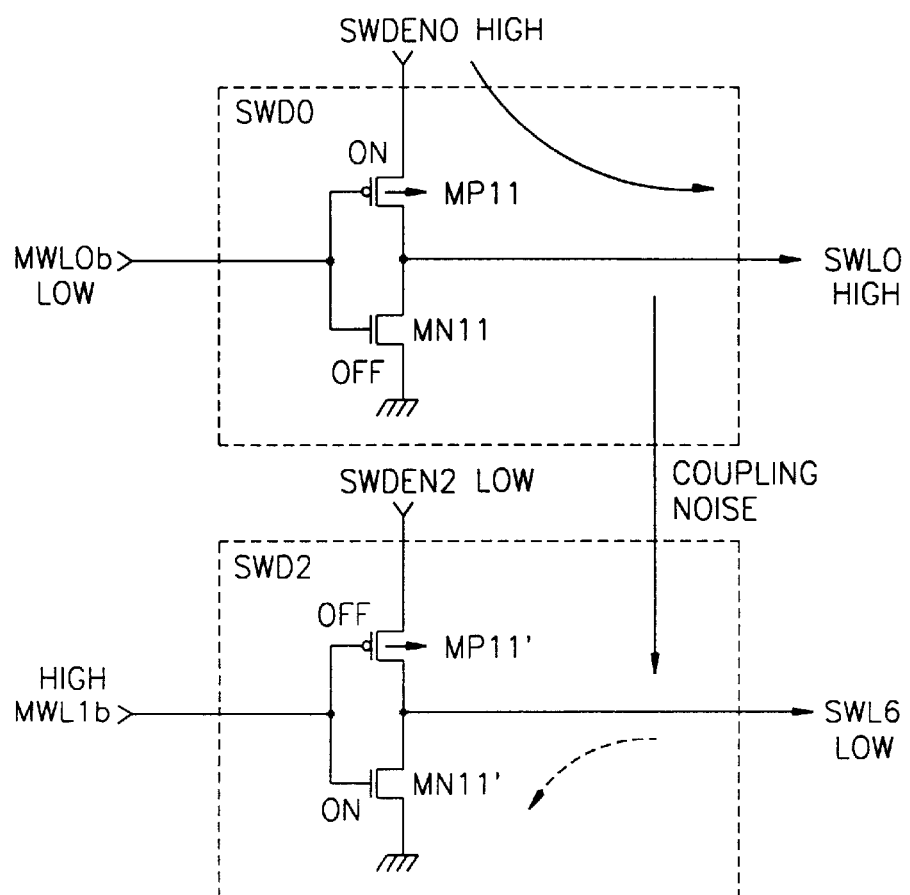
FIG. 6 is a circuit diagram illustrating a coupling noise of a sub-word line driver in FIG. 4.

As shown in FIG. 6, when the sub-word line SWL0 is driven by the sub-word line driver SWD0, a coupling noise may arise in the sub-word line SWL6, which is driven by the sub-word line driver SWD2. At this time, a high level signal is applied to the main word line MWL1b. Consequentially, a PMOS transistor MP11' of the sub-word line driver SWD2 is turned off, and an NMOS transistor MN11' is turned on. In addition, a low level sub-word line driver enable signal SWDEN2 is applied to the source of the PMOS transistor MP11'. Therefore, a coupling noise arising in the sub-word line SWL6 is shunted to ground through the NMOS transistor MN11'. Thus, the coupling noise is substantially eliminated.

Figure 7:
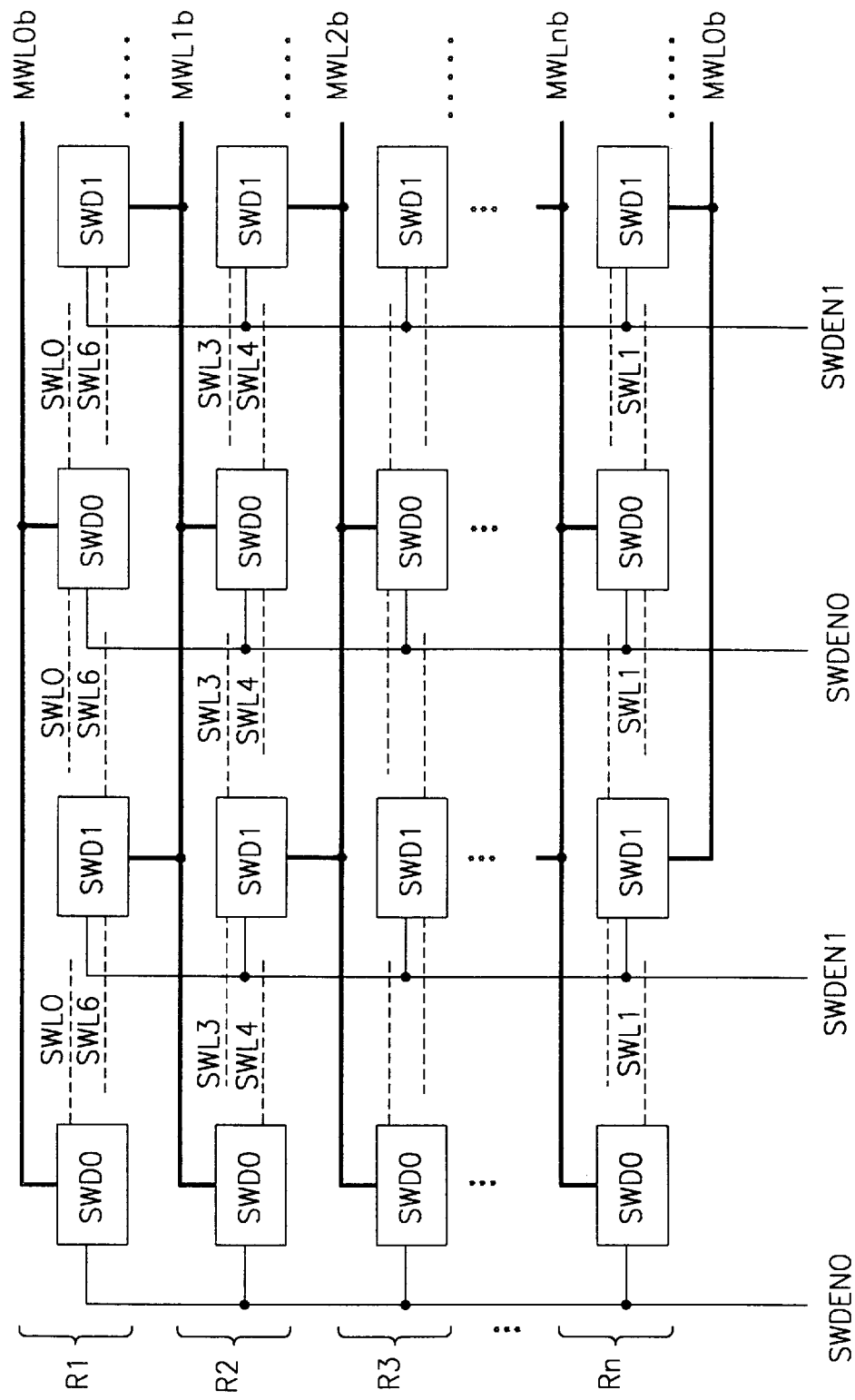
FIG. 7 is a diagram illustrating a hierarchical word line structure according to another preferred embodiment of the present invention.

A second preferred embodiment of the hierarchical word line structure according to the present invention is shown in FIG. 7. Each of the word line rows R1 through Rn in FIG. 7 may include one sub-word line driver SWD0 or SWD1. Operations of the second preferred embodiment are similar to the first preferred embodiment. Accordingly, a detailed description is omitted.

Figure 8:
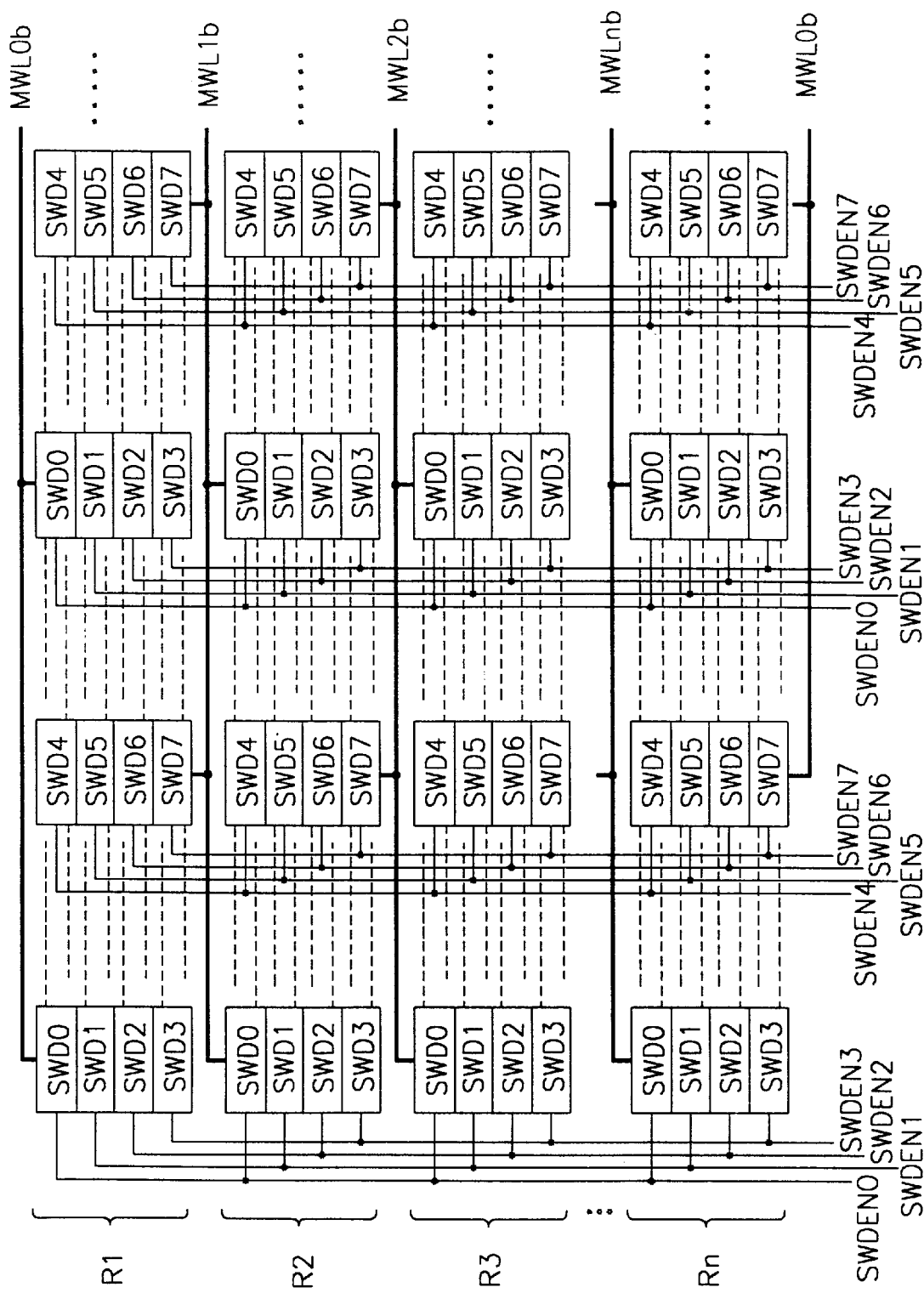
FIG. 8 is a diagram illustrating yet another preferred embodiment of a hierarchical word line structure according to the present invention.

A third preferred embodiment of a hierarchical word line structure according to the present invention shown in FIG. 8. Each of the word line rows R1 through Rn in FIG. 8 may include four sub-word line drivers SWD0 through SWD3 or SWD4 through SWD7. Sub-word line driver enable signals SWDEN0 through SWDEN3 are applied to the pairs of the (2n+1)th sub-word line drivers SWD0 through SWD3 of each of the word line rows R1 through Rn. Sub-word line driver enable signals SWDEN4 through SWDEN7 are applied to the pairs of the (2n)th sub-word line drivers SWD4 through SWD7. Operations of the third preferred embodiment are similar to the first preferred embodiment. Accordingly, a detailed description is omitted.

As described above, the preferred embodiments of the hierarchical word line structure according to the present invention have various advantages. The preferred embodiments avoid a narrow pitch problem of a word line wiring by driving neighboring sub-word lines by using different main word lines. Further, the preferred embodiment allows a layout size to be decreased.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A word line circuit for a semiconductor device, comprising:

a plurality of word lines; and a plurality of word line rows, each word line row including a pair of sub-word line driving units that receive at least one sub-word line driver enable signals, wherein each of the word line rows correspond to one of the plurality of word lines, and wherein the pair of the sub-word line driving units are coupled with different word lines of the plurality of word lines.

2. The word line circuit of claim 1, wherein only one of the sub-word line driver enable signals is enabled.

3. The word line circuit of claim 1, wherein each of the plurality of word line rows comprises a plurality of sub-word lines, and wherein each of the pair of the sub-word line driving units comprises a plurality of sub-word line drivers.

4. The word line circuit of claim 3, wherein the pair of sub-word line driving units drive adjacent sub-word lines of the plurality of sub-word lines.

5. The word line circuit of claim 3, wherein each of the sub-word line drivers comprises:

a first transistor having a control electrode coupled with a word line of the plurality of word lines, a first electrode that receives a sub-word line driver enable signal of the at least one sub-word line driver enable signals and a second electrode coupled to a sub-word line of the plurality of sub-word lines corresponding to the sub-word line driver enable signal; and a second transistor having a control electrode coupled to the word line, a second electrode coupled with the sub-word line, and a first electrode coupled to a reference voltage.

6. The word line circuit of claim 5, wherein the control electrode is a gate electrode, the first electrode is a source electrode and the second electrode is a drain electrode, wherein the reference voltage is ground, and wherein the first transistor is a PMOS transistor and the second transistor is an NMOS transistor.

7. The word line circuit of claim 1, wherein a first word line among the plurality of word lines is coupled to two sub-word line drivers included in a first odd word line row of the plurality of word line rows, wherein the remaining word lines of the plurality of word lines are respectively coupled to two sub-word line drivers of a corresponding even word line row of the plurality of word line rows and two sub-word line drivers of a corresponding odd word line row of the plurality of word line rows, and wherein two sub-word line drivers included in a last even word line row of the plurality of word line rows are coupled to the first word line.

8. The word line circuit of claim 1, wherein each of the word line rows correspond to different ones of the word lines.

9. The word line circuit of claim 1, wherein each of the plurality of word line rows include a respective word line driver.

10. The word line circuit of claim 1, wherein each of the plurality of word line rows include four sub-word line drivers, and wherein each of the word lines is driven based on a low level signal.

11. A hierarchical word line circuit for a semiconductor memory device, comprising:

a plurality of word lines; and a plurality of word line rows, each word line row including a plurality of sub-word line driving means for receiving at least one sub-word line driver enable signals, wherein each of the word line rows correspond to one of the plurality of word lines, and wherein each of the plurality of the sub-word line driving means are coupled with different word lines of the plurality of word lines.

12. The hierarchical word line circuit of claim 11, wherein only one of the sub-word line driver enable signals is enabled.

13. The hierarchical word line circuit of claim 11, wherein each of the plurality of word line rows comprises a plurality of sub-word lines, wherein each of the plurality of sub-word line driving means drive adjacent sub-word lines of the plurality of sub-word lines.

14. The hierarchical word line circuit of claim 11, wherein each of the plurality of sub-word line driving means comprises a plurality of sub-word line drivers.

15. The hierarchical word line circuit of claim 14, wherein each of the sub-word line drivers comprises:

a first transistor having a control electrode coupled with a word line of the plurality of word lines, a first electrode that receives a sub-word line driver enable signal and a second electrode coupled to a sub-word line of the plurality of sub-word lines corresponding to the sub-word line driver enable signal; and a second transistor having a control electrode coupled to the word line, a second electrode coupled with the sub-word line, and a first electrode coupled to a reference voltage.

16. The hierarchical word line circuit of claim 15, wherein the control electrode is a gate electrode, the first electrode is a source electrode and the second electrode is a drain electrode, wherein the reference voltage is ground, and wherein the first transistor is a PMOS transistor and the second transistor is an NMOS transistor.

17. The hierarchical word line circuit of claim 11, wherein a first word line among the word lines is coupled to one of the plurality of sub-word line driving means included in a first odd word line row of the plurality of word line rows, wherein remaining word lines of the plurality of word lines are respectively coupled to one of the plurality of sub-word line driving means of a corresponding even word line row of the plurality of word line rows and another of the plurality of sub-word line driving means of a corresponding odd word line row of the plurality of word line rows, and wherein said another of the plurality of sub-word line driving means included in a last even word line row of the plurality of word line rows are coupled to the first word line.

* * * * *